United States Patent
Pagaila

(10) Patent No.: US 8,367,470 B2
(45) Date of Patent: Feb. 5, 2013

(54) SEMICONDUCTOR DEVICE AND METHOD OF FORMING CAVITY IN BUILD-UP INTERCONNECT STRUCTURE FOR SHORT SIGNAL PATH BETWEEN DIE

(75) Inventor: Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 601 days.

(21) Appl. No.: 12/537,824

(22) Filed: Aug. 7, 2009

(65) Prior Publication Data

US 2011/0031634 A1 Feb. 10, 2011

(51) Int. Cl.
*H01L 21/00* (2006.01)

(52) U.S. Cl. .............. 438/108; 438/127; 257/E21.499

(58) Field of Classification Search .......... 438/106, 438/108, 127; 257/777, 686, E21.499, E21.502
See application file for complete search history.

(56) References Cited

U.S. PATENT DOCUMENTS

| | | | |
|---|---|---|---|
| 5,250,843 A | 10/1993 | Eichelberger | |
| 5,353,498 A * | 10/1994 | Fillion et al. | 29/840 |
| 5,841,193 A | 11/1998 | Eichelberger | |
| 6,960,826 B2 * | 11/2005 | Ho et al. | 257/723 |
| 7,026,719 B2 | 4/2006 | Wang | |
| 7,619,901 B2 * | 11/2009 | Eichelberger et al. | 361/763 |
| 2004/0033673 A1 * | 2/2004 | Cobbley et al. | 438/455 |
| 2007/0164418 A1 | 7/2007 | Brunnbauer | |
| 2008/0023824 A1 * | 1/2008 | Salzman | 257/724 |
| 2009/0039523 A1 * | 2/2009 | Jiang et al. | 257/777 |
| 2010/0001396 A1 * | 1/2010 | Meyer et al. | 257/723 |

\* cited by examiner

*Primary Examiner* — Chuong A Luu
*Assistant Examiner* — Nga Doan
(74) *Attorney, Agent, or Firm* — Robert D. Atkins; Atkins & Associates, P.C.

(57) ABSTRACT

In a semiconductor device, a first semiconductor die is mounted with its active surface oriented to a temporary carrier. An encapsulant is deposited over the first semiconductor die and temporary carrier. The temporary carrier is removed to expose a first side of the encapsulant and active surface of the first semiconductor die. A masking layer is formed over the active surface of the first semiconductor die. A first interconnect structure is formed over the first side of the encapsulant. The masking layer blocks formation of the first interconnect structure over the active surface of the first semiconductor die. The masking layer is removed to form a cavity over the active surface of the first semiconductor die. A second semiconductor die is mounted in the cavity. The second semiconductor die is electrically connected to the active surface of the first semiconductor die with a short signal path.

36 Claims, 12 Drawing Sheets

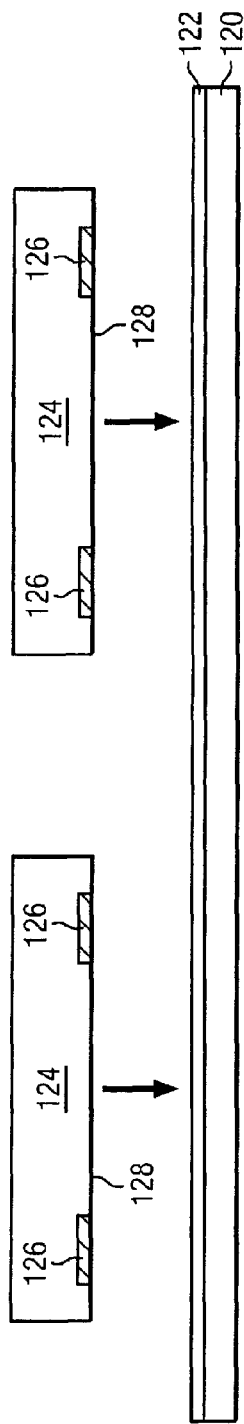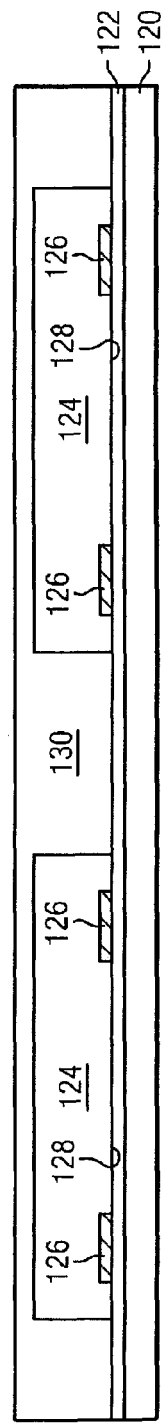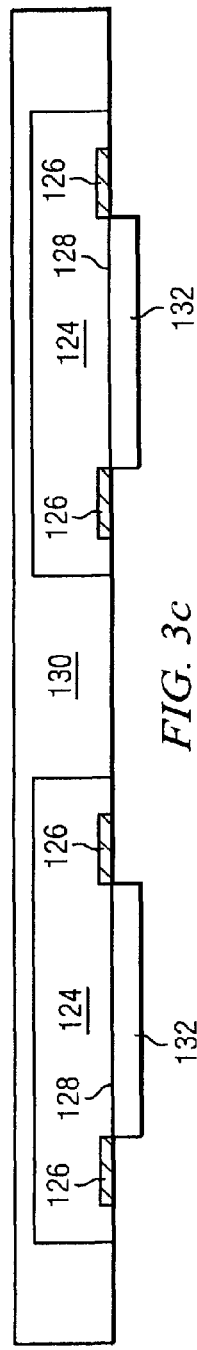

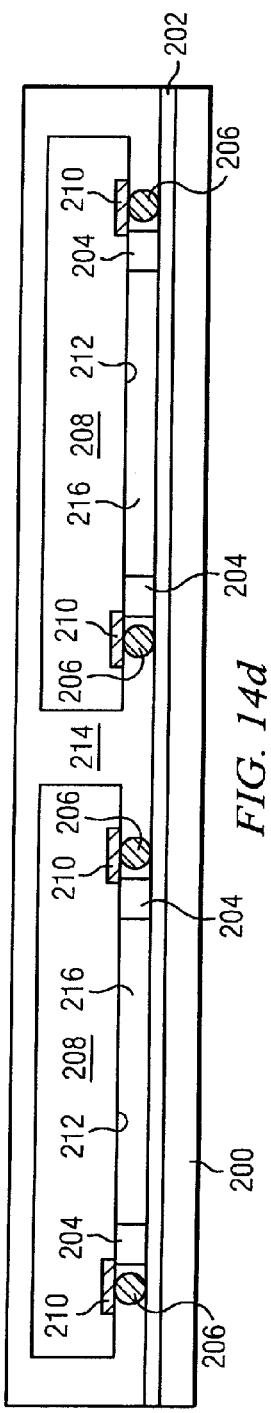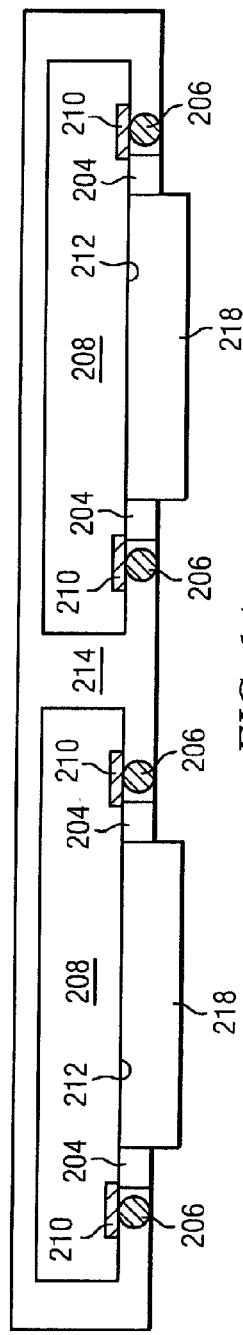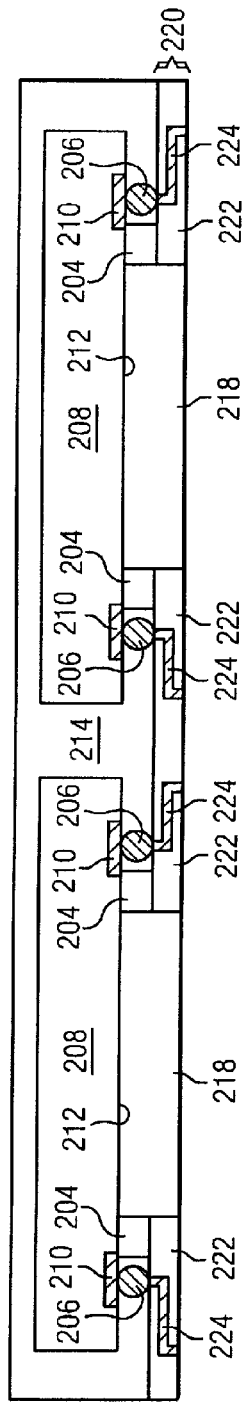

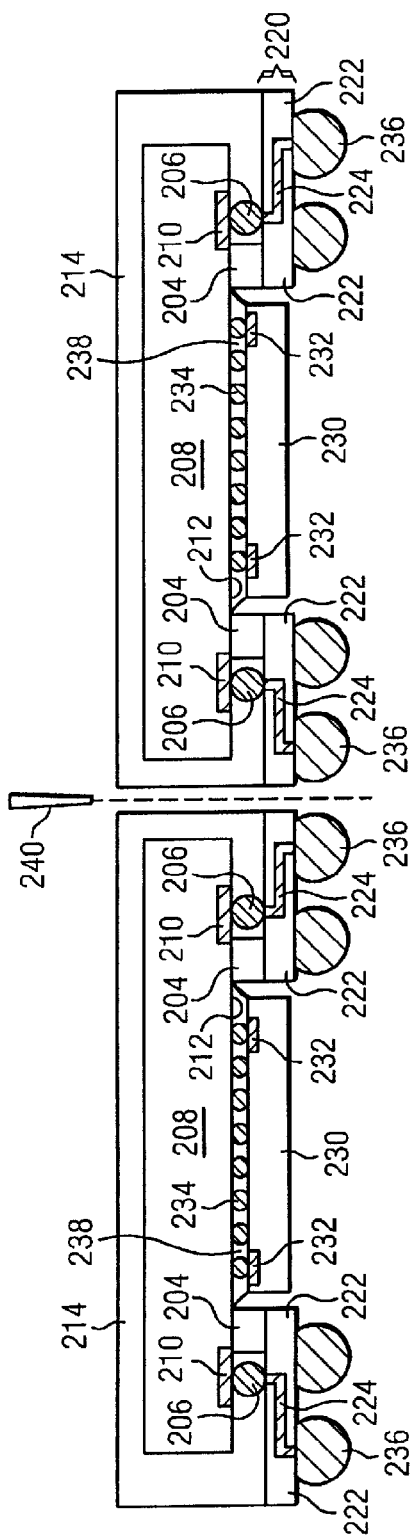
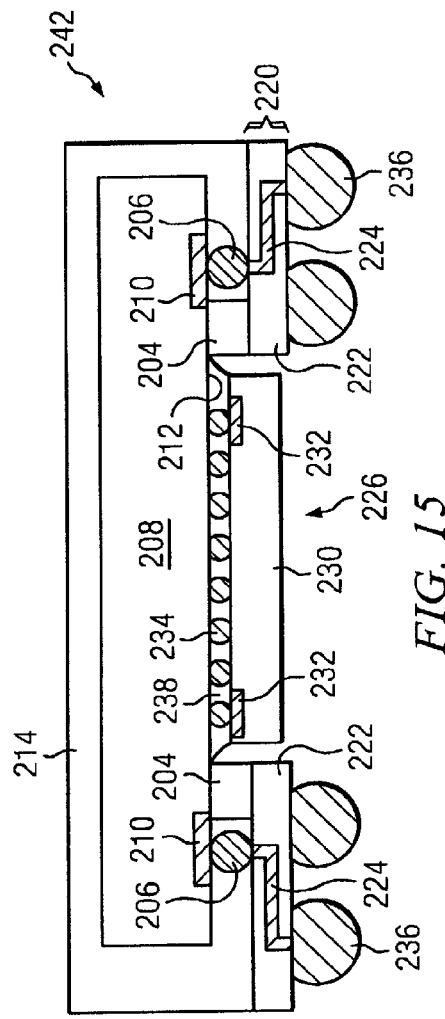

SEMICONDUCTOR DEVICE AND METHOD OF FORMING CAVITY IN BUILD-UP INTERCONNECT STRUCTURE FOR SHORT SIGNAL PATH BETWEEN DIE

FIELD OF THE INVENTION

The present invention relates in general to semiconductor devices and, more particularly, to a semiconductor device and method of forming a cavity between portions of a build-up interconnect structure. A lower semiconductor die is mounted in the cavity to provide a short signal path to an upper semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection in a fan-out wafer level chip scale package (FO-WLCSP) containing semiconductor devices stacked on multiple levels can be accomplished with conductive through silicon vias (TSV), through hole vias (THV), or Cu-plated conductive pillars. Vias are formed in silicon or organic material around the die using laser drilling or deep reactive ion etching (DRIE). The vias are filled with conductive material, for example by copper deposition using an electroplating process, to form the conductive TSVs and THVs. The TSVs and THVs further connect through build-up interconnect structures which are formed across each semiconductor die.

In high-speed semiconductor devices, such as used in communication applications, the stack semiconductor die need to communicate in a fast and efficient manner. In conventional FO-WLCSP, the signals between the stacked die must be routed through build-up interconnect layers, as well as the TSVs and THVs, which causes long signal paths. The longer signal path reduces the operating speed of the FO-WLCSP. In addition, the build-up interconnect layers are formed across each semiconductor die, even in areas not used for signal routing, which unnecessarily adds manufacturing materials and cost.

SUMMARY OF THE INVENTION

A need exists for a high speed vertical interconnect structure in FO-WLCSP. Accordingly, in one embodiment, the present invention is a method of making a semiconductor device comprising the steps of providing a temporary carrier, mounting a first semiconductor die with its active surface oriented to the temporary carrier, depositing an encapsulant over the first semiconductor die and temporary carrier, removing the temporary carrier to expose a first side of the encapsulant and active surface of the first semiconductor die, forming a masking layer over the active surface of the first semiconductor die, and forming a first interconnect structure over the first side of the encapsulant. The masking layer blocks formation of the first interconnect structure over the active surface of the first semiconductor die. The method further includes the steps of removing the masking layer to form a cavity over the active surface of the first semiconductor die, and mounting a second semiconductor die in the cavity. The second semiconductor die is electrically connected to the active surface of the first semiconductor die.

In another embodiment, the present invention is a method of making a semiconductor device comprising the steps of providing a temporary carrier, mounting a first semiconductor die with its active surface oriented to the temporary carrier, depositing an encapsulant over the first semiconductor die and temporary carrier, removing the temporary carrier to expose a first side of the encapsulant, forming a first interconnect structure over the first side of the encapsulant without covering the active surface of the first semiconductor die, and mounting a semiconductor component over the active surface of the first semiconductor die between portions of the first interconnect structure. The semiconductor component is electrically connected to the active surface of the first semiconductor die.

In another embodiment, the present invention is a method of making a semiconductor device comprising the steps of providing a first semiconductor die, depositing an encapsulant over the first semiconductor die, forming a first interconnect structure over the encapsulant without covering an active surface of the first semiconductor die, and mounting a semiconductor component over the active surface of the first semiconductor die between portions of the first interconnect structure. The semiconductor component is electrically connected to the active surface of the first semiconductor die.

In another embodiment, the present invention is a semiconductor device comprising a first semiconductor die and encapsulant deposited over the first semiconductor die. A first interconnect structure is formed over the encapsulant without covering an active surface of the first semiconductor die. A semiconductor component is mounted over the active surface of the first semiconductor die between portions of the first interconnect structure. The semiconductor component is electrically connected to the active surface of the first semiconductor die.

BRIEF DESCRIPTION OF THE DRAWINGS

FIGS. 3a-3g illustrate a process of forming a cavity between portions of the build-up interconnect structure for a short signal path between the upper and lower stacked die;

FIGS. 14a-14i illustrate another process of forming a cavity in the build-up interconnect structure for a short signal path between the upper and lower stacked semiconductor die; and FIG. 15 illustrates the FO-WLCSP with the short signal path between upper and lower stacked semiconductor die.

DETAILED DESCRIPTION OF THE DRAWINGS

Figure 1:
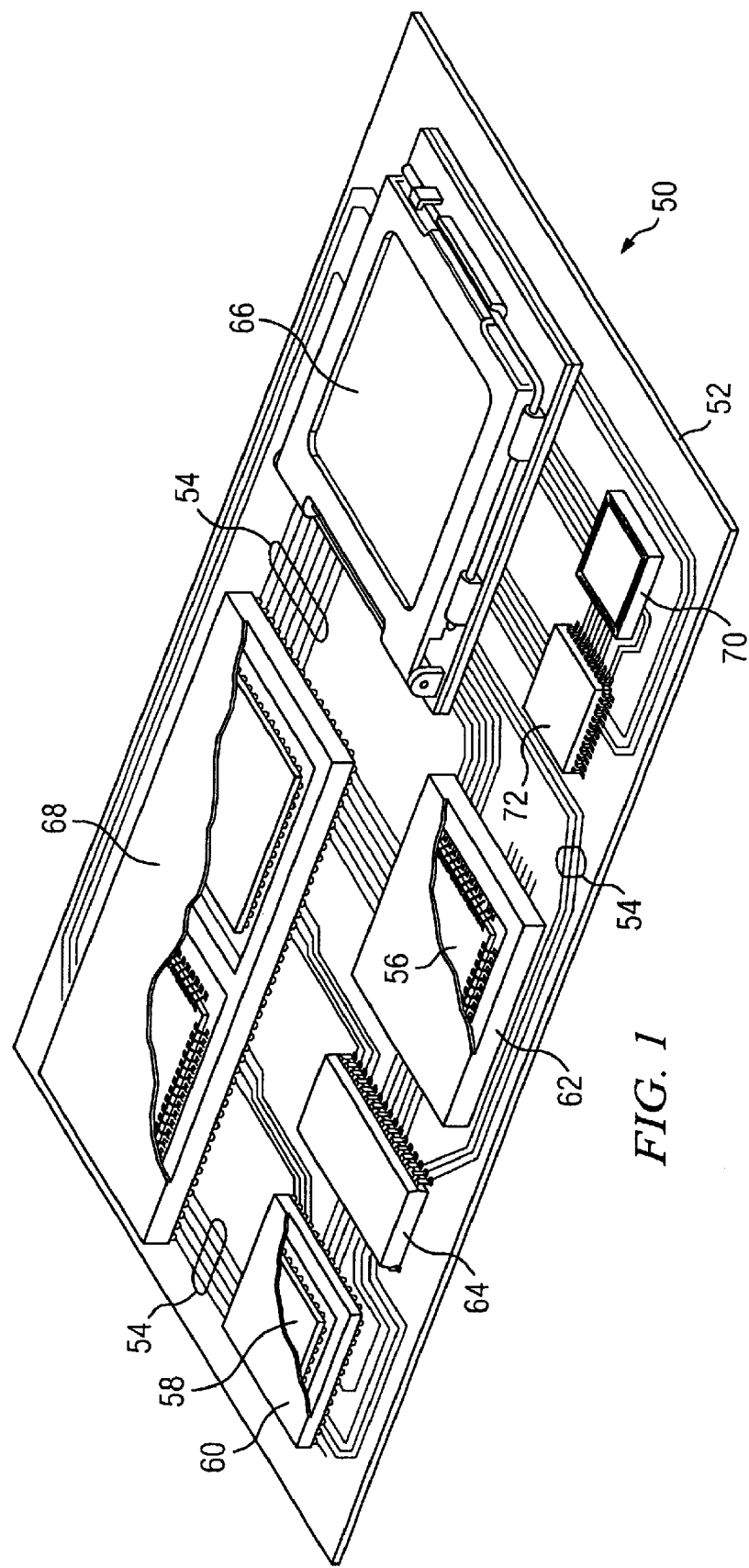
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
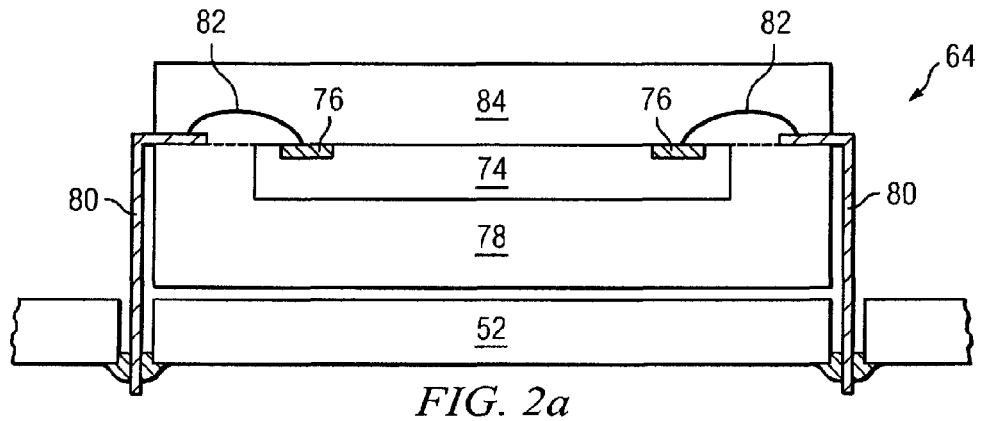
FIGS. 2a-2c illustrate further detail of the representative semiconductor packages mounted to the PCB.
Figure 2B:
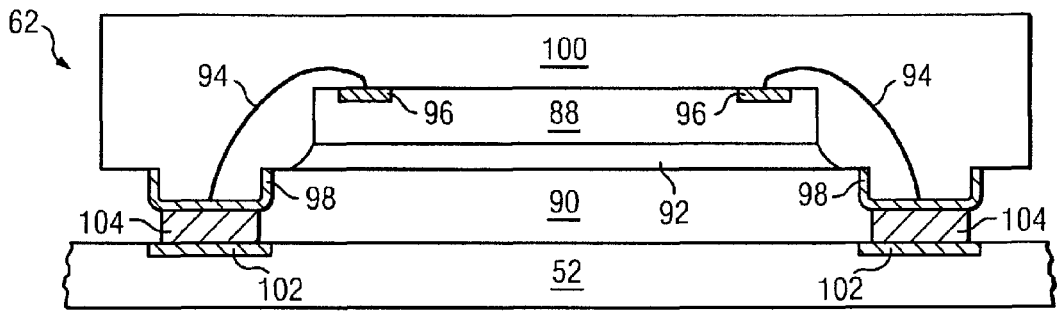
Figure 2C:
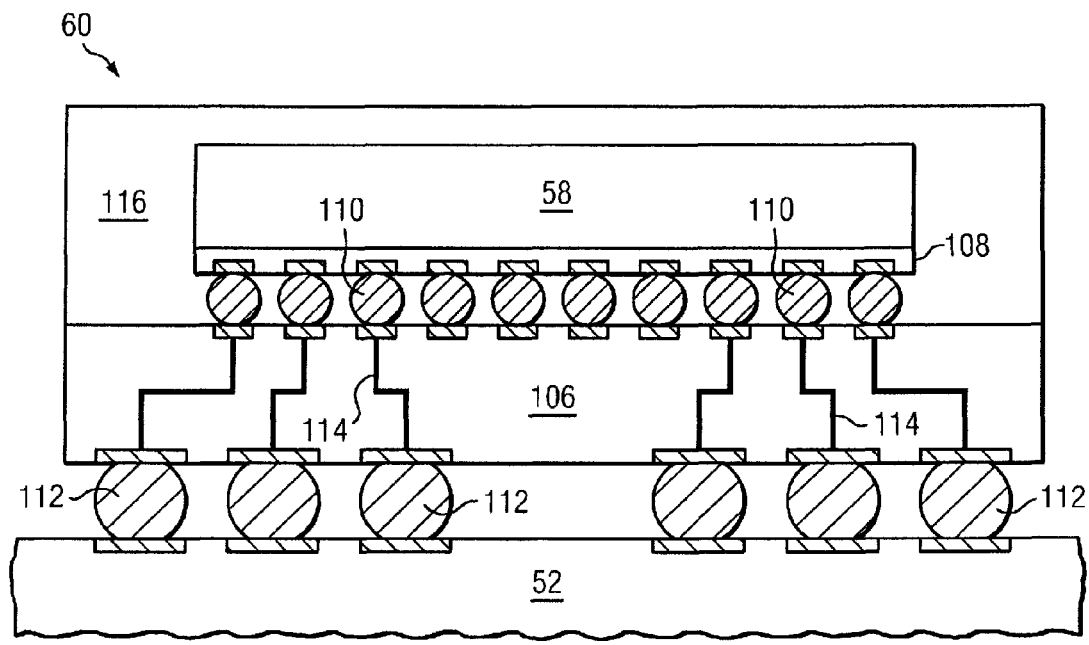

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3D:
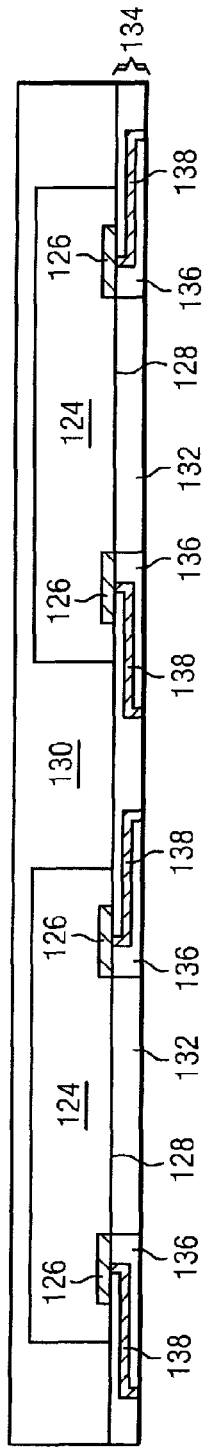
Figure 3E:
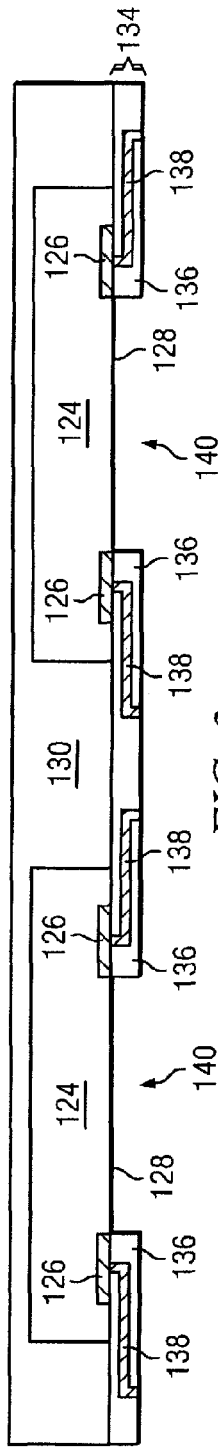

FIGS. 3a-3g illustrate, in relation to FIGS. 1 and 2a-2c, a process of forming a cavity between portions of the build-up interconnect structure for a short signal path between upper and lower stacked semiconductor die in a FO-WLCSP. In FIG. 3a, a wafer-form substrate or carrier 120 contains temporary or sacrificial base material such as silicon, polymer, polymer composite, metal, ceramic, glass, glass epoxy, beryllium oxide, or other suitable low-cost, rigid material or bulk semiconductor material for structural support. Carrier 120 can also be tape. In one embodiment, carrier 120 is 20.3 centimeters (cm) in diameter. An optional interface layer 122 can be formed over carrier 120 as a temporary bonding film or etch-stop layer.

Semiconductor die or components 124 are mounted to interface layer 122 with contact pads 126 on active surface 128 oriented downward toward carrier 120. Active surface 128 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, memory, or other signal processing circuit. Semiconductor die 124 may also contain IPD, such as inductors, capacitors, and resistors, for RF signal processing. A typical RF system requires multiple IPDs in one or more semiconductor packages to perform the necessary electrical functions.

In FIG. 3b, an encapsulant or molding compound 130 is deposited over semiconductor die 124 using a paste printing, compressive molding, transfer molding, liquid encapsulant molding, vacuum lamination, or other suitable applicator. Encapsulant 130 can be polymer composite material, such as epoxy resin with filler, epoxy acrylate with filler, or polymer with proper filler. Encapsulant 130 is non-conductive and environmentally protects the semiconductor device from external elements and contaminants.

In FIG. 3c, carrier 120 and optional interface layer 122 are removed by chemical etching, mechanical peel-off, CMP, mechanical grinding, thermal bake, laser scanning, or wet stripping. A masking layer 132 is formed over active surface 128 between contact pads 126.

In FIG. 3d, a bottom-side build-up interconnect structure 134 is formed over semiconductor die 124 and encapsulant 130. The build-up interconnect structure 134 includes an insulating or passivation layer 136 containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 136 is formed using PVD, CVD, printing, spin coating, spray coating, sintering or thermal oxidation.

The bottom-side build-up interconnect structure 134 further includes an electrically conductive layer 138 formed in insulating layer 136 using a patterning and metal deposition process such as PVD, CVD, sputtering, electrolytic plating, and electroless plating. Conductive layer 138 can be one or more layers of Al, Cu, Sn, Ni, Au, Ag, or other suitable electrically conductive material. One portion of conductive layer 138 is electrically connected to contact pads 126 of semiconductor die 124. Other portions of conductive layer 138 can be electrically common or electrically isolated depending on the design and function of the semiconductor device.

Masking layer 132 blocks formation of build-up interconnect structure 134 over active surface 128 of semiconductor die 124. Masking layer 132 is removed in FIG. 3e leaving cavity 140 which exposes active surface 128 from the bottom-side of semiconductor die 124.

Figure 3F:
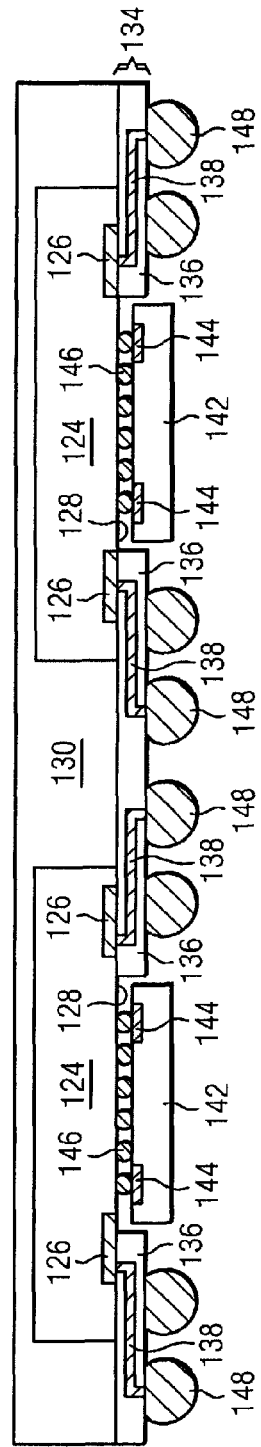

In FIG. 3f, semiconductor die or components 142 are mounted within cavity 140, between portions of build-up interconnect structure 134, to contact pads on active surface 128 with contact pads 144 oriented upward. Bumps 146 provide the electrical connection between contact pads 144 and active surface 128. Semiconductor die 142 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 142 may also contain IPD, such as inductors, capacitors, and resistors, for RF signal processing. A typical RF system requires multiple IPDs in one or more semiconductor packages to perform the necessary electrical functions.

An electrically conductive bump material is deposited over build-up interconnect structure 134 and electrically connected to conductive layer 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 138 using a suitable attachment or bonding process. In one embodiment, the bump material is reflowed by heating the material above its melting point to form spherical balls or bumps 148. In some applications, bumps 148 are reflowed a second time to improve electrical contact to conductive layer 138. The bumps can also be compression bonded to conductive layer 138. Bumps 148 represent one type of interconnect structure that can be formed over conductive layer 138. The interconnect structure can also use bond wires, stud bump, micro bump, or other electrical interconnect.

Figure 3G:
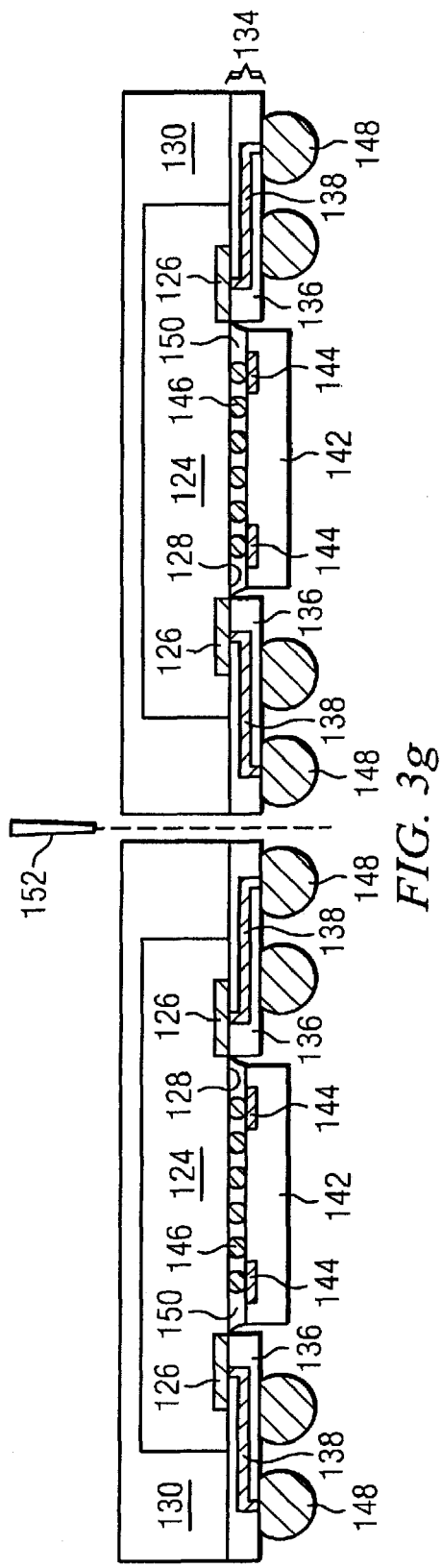

In FIG. 3g, an underfill material 150 such as epoxy resin is deposited between semiconductor die 124 and 142. Semiconductor die 124 are singulated with saw blade or laser cutting device 152 into individual semiconductor devices.

Figure 4:
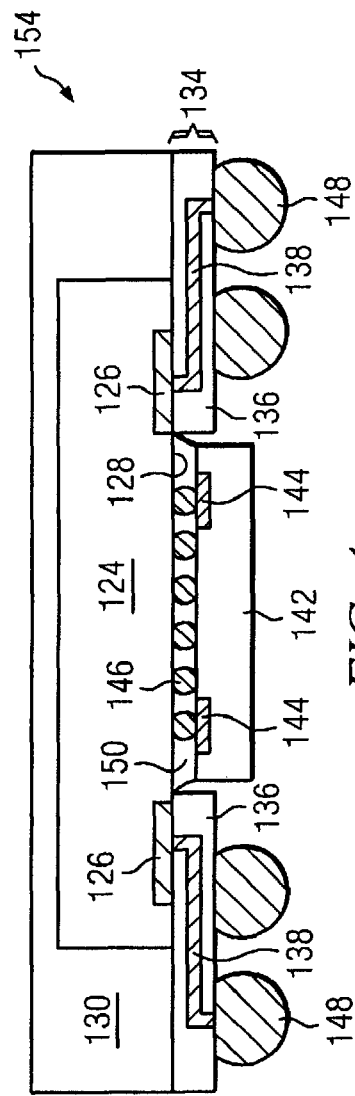
FIG. 4 illustrates the FO-WLCSP with the short signal path between upper and lower stacked semiconductor die.

FIG. 4 shows FO-WLCSP 154 after singulation. Semiconductor die 142 is mounted in cavity 140 formed between portions of the bottom-side build-up interconnect structure 134 using masking layer 132. Semiconductor die 124 and 142 are electrically interconnected with bumps 146. By placing semiconductor die 142 in cavity 140, the separation between the die is reduced resulting in a short and efficient signal path to improve electrical performance and increase operating speed of FO-WLCSP 154. The height of semiconductor die 142, including bumps 146, is less than the height of bumps 148. The overall height of FO-WLCSP 154 is reduced with the above novel manufacturing process and structure.

Figure 5:
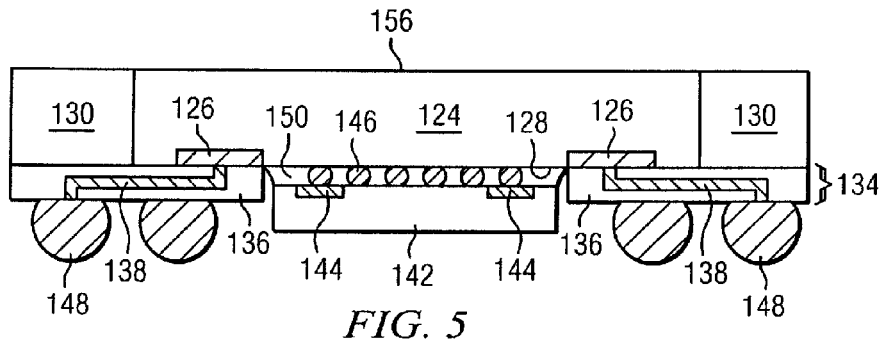
FIG. 5 illustrates the back surface of the upper semiconductor die exposed.

In FIG. 5, a portion of encapsulant 130 is removed by an etching process to expose back surface 156 of semiconductor die 124.

Figure 6:
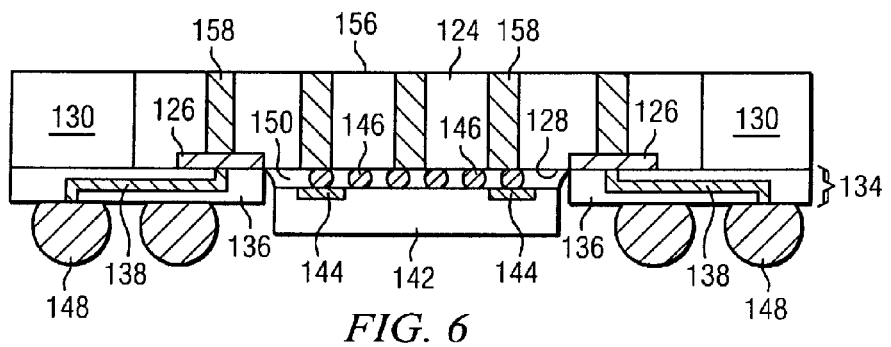
FIG. 6 illustrates a TSV formed through the upper semiconductor die.

In FIG. 6, a portion of encapsulant 130 is removed by an etching process to expose back surface 156 of semiconductor die 124. A plurality of vias is formed through semiconductor die 124 using laser drilling or etching process, such as DRIE. The vias are filled with Al, Cu, Sn, Ni, Au, Ag, titanium (Ti), W, poly-silicon, or other suitable electrically conductive material using PVD, CVD, electrolytic plating, electroless plating process, or other suitable metal deposition process to form conductive TSV 158. TSV 158 can be formed in semiconductor die 124 prior to mounting the die to interface layer 122 in FIG. 3a. TSV 158 can be electrically interconnected according to the design of the die.

Figure 7:
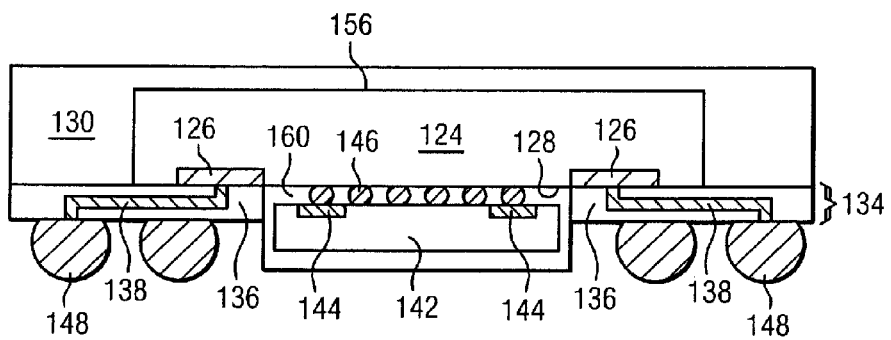
FIG. 7 illustrates an encapsulant formed around the lower semiconductor die.

FIG. 7 shows an encapsulant or molding compound 160 deposited over and around semiconductor die 142 using a paste printing, compressive molding, transfer molding, liquid encapsulant molding, vacuum lamination, or other suitable applicator. Encapsulant 160 can be polymer composite material, such as epoxy resin with filler, epoxy acrylate with filler, or polymer with proper filler. Encapsulant 160 is non-conductive and environmentally protects the semiconductor device from external elements and contaminants.

Figure 8:
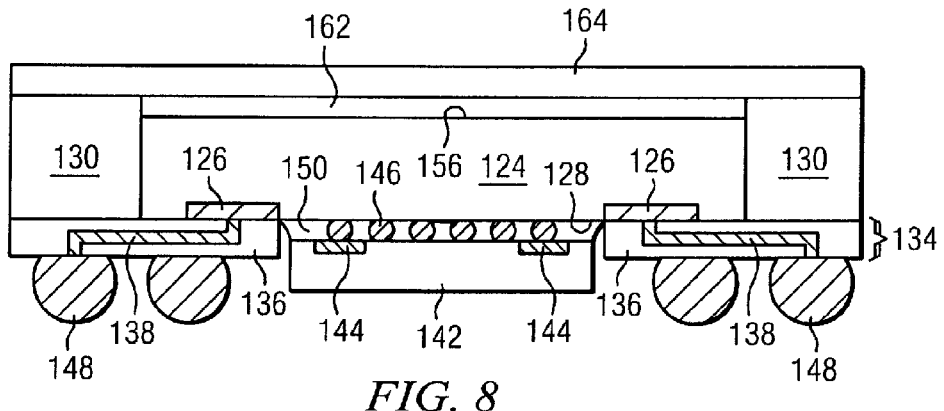
FIG. 8 illustrates a TIM and heat sink formed over the upper semiconductor die.

In FIG. 8, a portion of encapsulant 130 is removed to expose back surface 156 of semiconductor die 124. A thermal interface material (TIM) 162 is deposited over back surface 156 of semiconductor die 124, opposite active surface 128. TIM 162 can be aluminum oxide, zinc oxide, boron nitride, or pulverized silver. A heat sink 164 is mounted over TIM 162 and encapsulant 130. Heat sink 164 can be Al, Cu, or another material with high thermal conductivity to provide heat dissipation for semiconductor die 124. TIM 162 aids in the distribution and dissipation of heat generated by semiconductor die 124.

Figure 9:
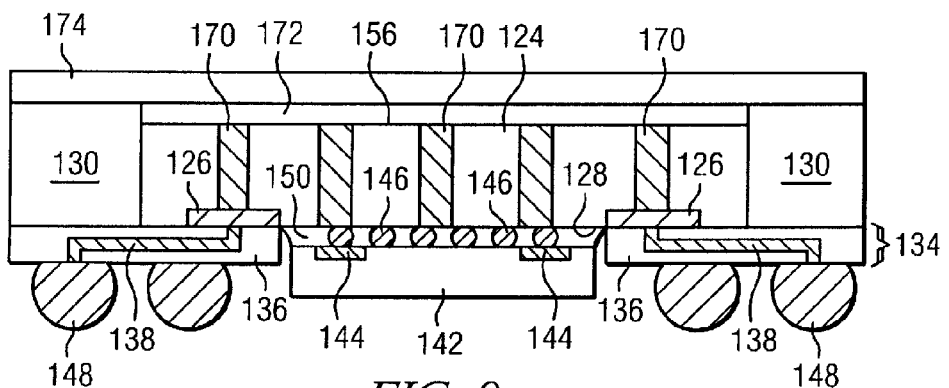
FIG. 9 illustrates the TSV formed through and TIM and heat sink formed over the upper semiconductor die.

In FIG. 9, a portion of encapsulant 130 is removed by an etching process to expose back surface 156 of semiconductor die 124. A plurality of vias is formed through semiconductor die 124 using laser drilling or etching process, such as DRIE. The vias are filled with Al, Cu, Sn, Ni, Au, Ag, Ti, W, poly-silicon, or other suitable electrically conductive material using PVD, CVD, electrolytic plating, electroless plating process, or other suitable metal deposition process to form conductive TSV 170. TSV 170 can be formed in semiconductor die 124 prior to mounting the die to interface layer 122 in FIG. 3a. TSV 170 can be electrically interconnected according to the design of the die.

TIM 172 is deposited over back surface 156 of semiconductor die 124, opposite active surface 128. TIM 172 can be aluminum oxide, zinc oxide, boron nitride, or pulverized silver. A heat sink 174 is mounted over TIM 172 and encapsulant 130. Heat sink 174 can be Al, Cu, or another material with high thermal conductivity to provide heat dissipation for semiconductor die 124. TIM 172 aids in the distribution and dissipation of heat generated by semiconductor die 124.

Figure 10:
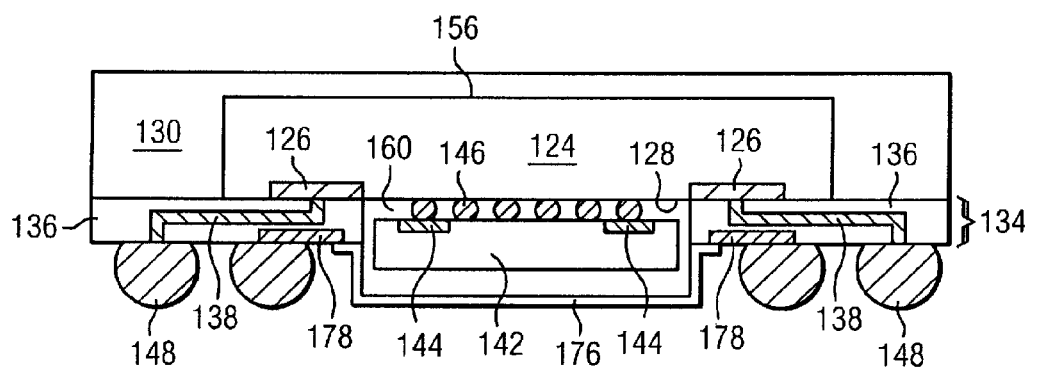
FIG. 10 illustrates an EMI shielding layer formed around the lower semiconductor die.

FIG. 10 shows a shielding layer 176 formed over semiconductor die 142. Shielding layer 176 can be Cu, Al, ferrite or carbonyl iron, stainless steel, nickel silver, low-carbon steel, silicon-iron steel, foil, epoxy, conductive resin, and other metals and composites capable of blocking or absorbing electromagnetic interference (EMI), radio frequency interference (RFI), and other inter-device interference. Shielding layer 176 can also be a non-metal material such as carbon-black or aluminum flake to reduce the effects of EMI and RFI. Shielding layer 176 is grounded through conductive layer 178 to bumps 148.

Figure 11:
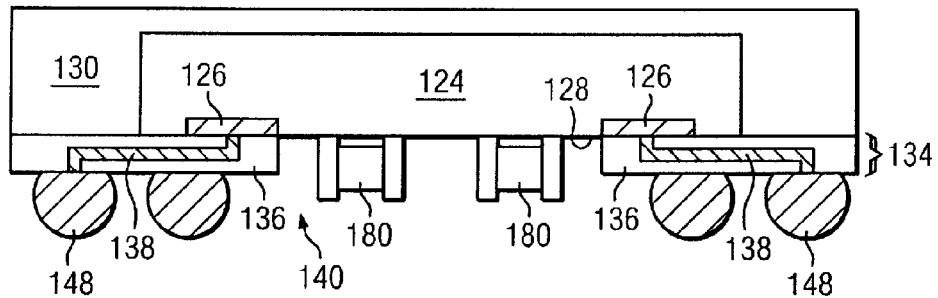
FIG. 11 illustrates a discrete semiconductor component mounted in the cavity and attached to the upper die.

FIG. 11 shows passive components 180 mounted to contact pads on active surface 128 in cavity 140. Passive components 180 can be resistors, capacitor, inductors, or discrete active devices.

Figure 12:
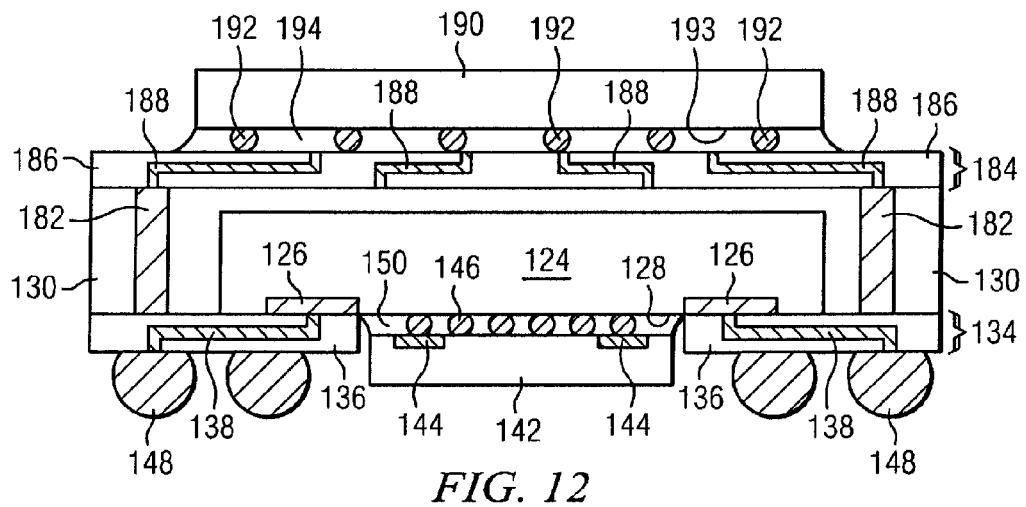
FIG. 12 illustrates a topside build-up interconnect structure and additional semiconductor die over the upper semiconductor die.

In FIG. 12, a plurality of vias is formed through encapsulant 130 using laser drilling or etching process, such as DRIE. The vias are filled with Al, Cu, Sn, Ni, Au, Ag, Ti, W, poly-silicon, or other suitable electrically conductive material using PVD, CVD, electrolytic plating, electroless plating process, or other suitable metal deposition process to form conductive THV 182. Alternatively, conductive pillars 182 are formed around semiconductor die 124 prior to depositing encapsulant 130. Conductive pillars 182 are formed by depositing a photoresist layer, etching vias in the photoresist, filling the vias with conductive material, and removing the photoresist layer, leaving the conductive pillars.

A topside build-up interconnect structure 184 is formed over encapsulant 130. The build-up interconnect structure 184 includes an insulating or passivation layer 186 containing one or more layers of $SiO_2$, $Si_3N_4$, SiON, $Ta_2O_5$, $Al_2O_3$, or other material having similar insulating and structural properties. The insulating layer 186 is formed using PVD, CVD, printing, spin coating, spray coating, sintering or thermal oxidation.

The topside build-up interconnect structure 184 further includes an electrically conductive layer 188 formed in insulating layer 186 using a patterning and metal deposition process such as PVD, CVD, sputtering, electrolytic plating, and electroless plating. Conductive layer 188 can be one or more layers of Al, Cu, Sn, Ni, Au, Ag, or other suitable electrically conductive material. One portion of conductive layer 188 is electrically connected to conductive vias 182. Other portions of conductive layer 188 can be electrically common or electrically isolated depending on the design and function of the semiconductor device. Conductive vias 182 are z-direction interconnects between bottom-side build-up interconnect structure 134 and topside build-up interconnect structure 184.

A semiconductor die or component 190 is mounted to build-up interconnect structure 184 with bumps 192. Semiconductor die 190 includes an active surface 193 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 193 to implement analog circuits or digital circuits, such as DSP, ASIC, memory, or other signal processing circuit. Semiconductor die 190 may also contain IPD, such as inductors, capacitors, and resistors, for RF signal processing. A typical RF system requires multiple IPDs in one or more semiconductor packages to perform the necessary electrical functions. An underfill material 194 such as epoxy resin is deposited beneath semiconductor die 190.

Figure 13:
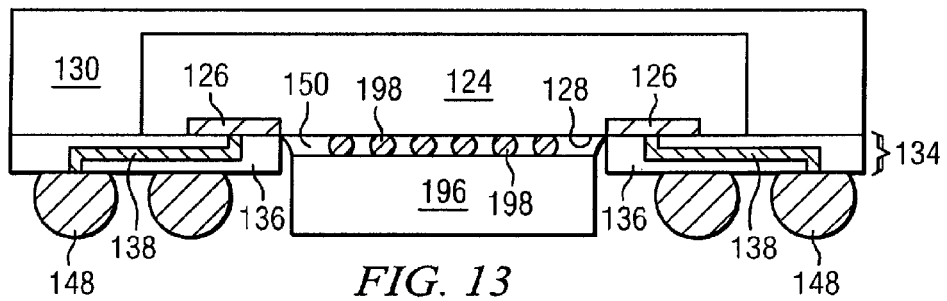
FIG. 13 illustrates a heat spreader mounted in the cavity and attached to the upper semiconductor die.

FIG. 13 shows heat spreader 196 in cavity 140 mounted to active surface 128 of semiconductor die 124 with bumps 198. Heat spreader 196 distributes and dissipates heat generated by semiconductor die 124.

Figure 14A:
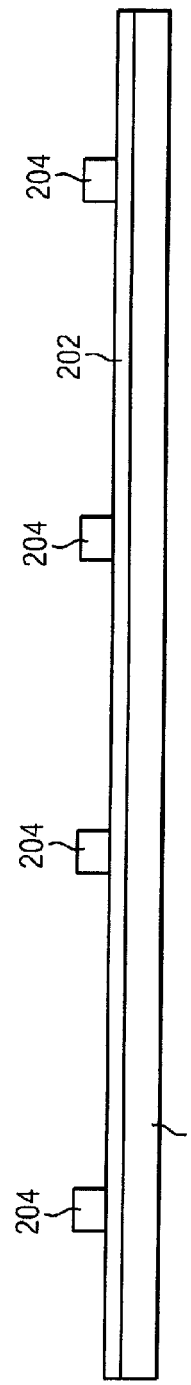

FIGS. 14a-14i illustrate another process of forming a cavity between portions of the build-up interconnect structure for a short signal path between upper and lower stacked semiconductor die in a FO-WLCSP. In FIG. 14a, a wafer-form substrate or carrier 200 contains temporary or sacrificial base material such as silicon, polymer, polymer composite, metal, ceramic, glass, glass epoxy, beryllium oxide, or other suitable low-cost, rigid material or bulk semiconductor material for structural support. Carrier 200 can also be tape. In one embodiment, carrier 200 is 20.3 cm in diameter. An optional interface layer 202 can be formed over carrier 200 as a temporary bonding film or etch-stop layer. A plurality of optional wettable pads can be formed over carrier 200. A plurality of dam walls 204 is deposited over interface layer 202 to form an enclosure around a designated area where the active surface of semiconductor die 208 will be located.

Figure 14B:
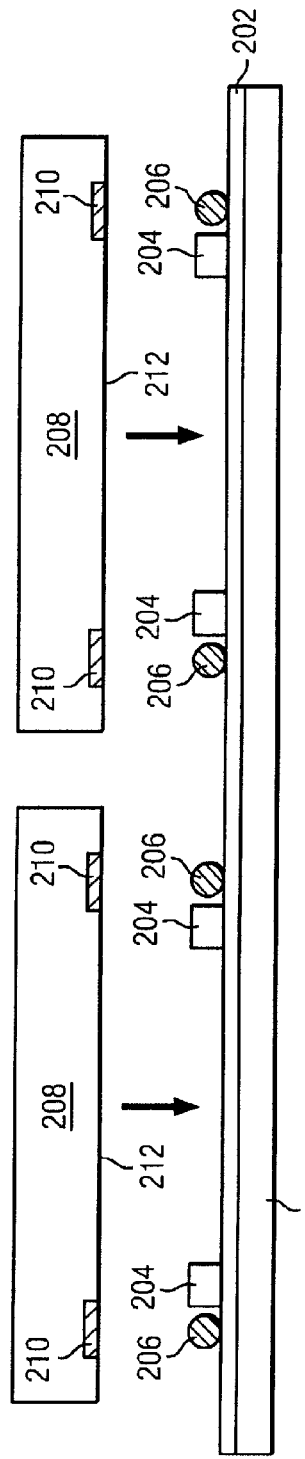

In FIG. 14b, bumps 206 are formed on interface layer 202. Semiconductor die or components 208 are mounted over bumps 206 with contact pads 210 on active surface 212 oriented downward toward carrier 200. Alternatively, bumps 206 can be formed on contact pads 210 prior to mounting semiconductor die 208 to carrier 200. Active surface 212 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 212 to implement analog circuits or digital circuits, such as DSP, ASIC, memory, or other signal processing circuit. Semiconductor die 208 may also contain IPD, such as inductors, capacitors, and resistors, for RF signal processing. A typical RF system requires multiple IPDs in one or more semiconductor packages to perform the necessary electrical functions.

Figure 14C:
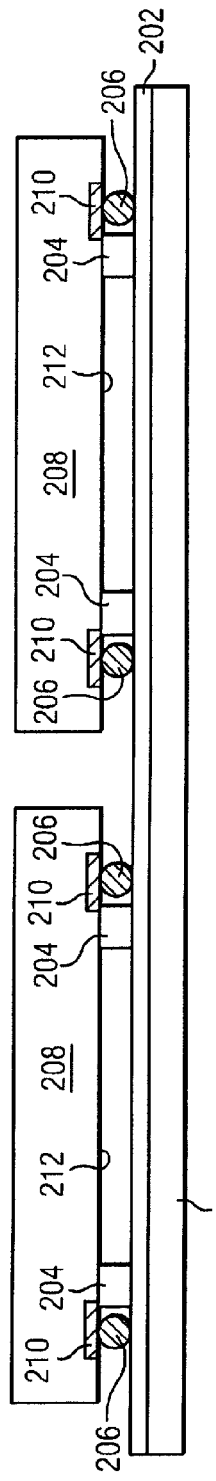
Figure 14G:
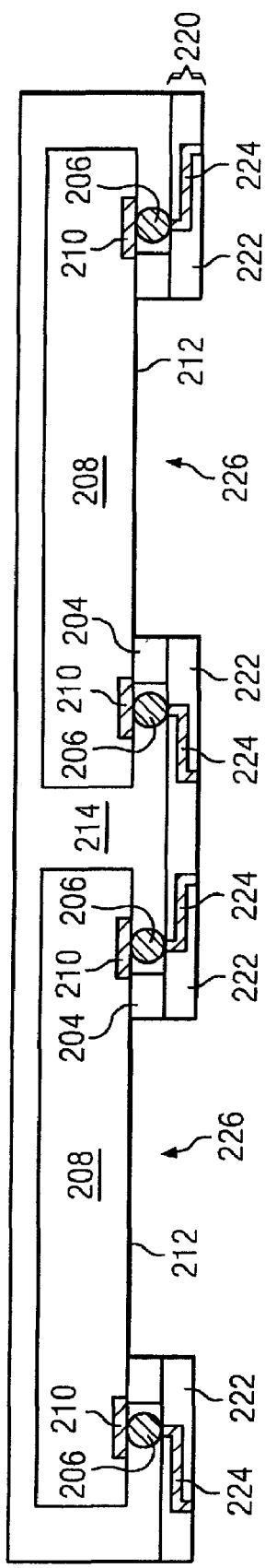

FIG. 14c shows contact pads 210 of semiconductor die 208 mounted to bumps 206 over interface layer 202. The height of bumps 206 is approximately the same height as dam walls 204. Dam walls 204 form a sealed enclosure around the area designated for active surface 212 between interface layer 202 and active surface 212.

In FIG. 14d, an encapsulant or molding compound 214 is deposited over semiconductor die 208 using a paste printing, compressive molding, transfer molding, liquid encapsulant molding, vacuum lamination, or other suitable applicator. Encapsulant 214 can be polymer composite material, such as epoxy resin with filler, epoxy acrylate with filler, or polymer with proper filler. Encapsulant 214 is non-conductive and environmentally protects the semiconductor device from external elements and contaminants. The enclosure formed by dam walls 204 provides a seal to prevent encapsulant 214 from spreading to the interior portion of active surface 212 between contact pads 210. Accordingly, dam walls 204 form cavity 216 below active surface 212 of semiconductor die 208.

In FIG. 14e, carrier 200 and optional interface layer 202 are removed by chemical etching, mechanical peel-off, CMP, mechanical grinding, thermal bake, laser scanning, or wet stripping. A masking layer 218 is formed in cavity 216 over active surface 212 between contact pads 210.

In FIG. 14f, a bottom-side build-up interconnect structure 220 is formed over semiconductor die 208 and encapsulant 214. The build-up interconnect structure 220 includes an insulating or passivation layer 222 containing one or more layers of SiO2, Si3N4, SiON, Ta2O5, Al2O3, or other material having similar insulating and structural properties. The insulating layer 222 is formed using PVD, CVD, printing, spin coating, spray coating, sintering or thermal oxidation.

The bottom-side build-up interconnect structure 220 further includes an electrically conductive layer 224 formed in insulating layer 222 using a patterning and metal deposition process such as PVD, CVD, sputtering, electrolytic plating, and electroless plating. Conductive layer 224 can be one or more layers of Al, Cu, Sn, Ni, Au, Ag, or other suitable electrically conductive material. One portion of conductive layer 224 is electrically connected through bumps 206 to contact pads 210 of semiconductor die 208. Other portions of conductive layer 224 can be electrically common or electrically isolated depending on the design and function of the semiconductor device.

Masking layer 218 blocks formation of build-up interconnect structure 220 over active surface 212 of semiconductor die 208. Masking layer 218 is removed in FIG. 14g leaving cavity 226 which exposes active surface 212 from the bottom-side of semiconductor die 208.

Figure 14H:
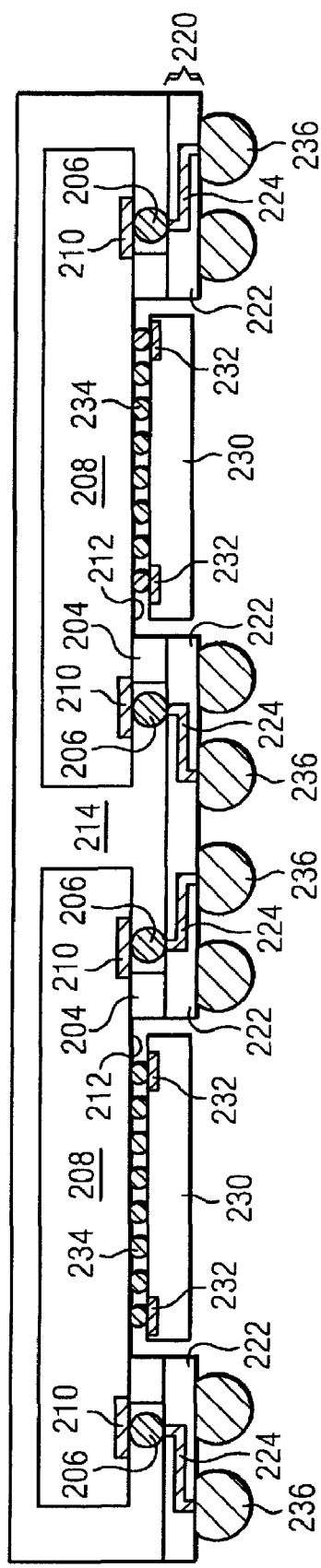

In FIG. 14h, semiconductor die or components 230 are mounted within cavity 226, between portions of build-up interconnect structure 220, to contact pads on active surface 212 with contact pads 232 oriented upward. Bumps 234 provide the electrical connection between contact pads 232 and active surface 212. The combination of dam walls 204 and masking layer 218 provide a deeper cavity 226 to house semiconductor die 230 having greater thickness. Semiconductor die 230 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 230 may also contain IPD, such as inductors, capacitors, and resistors, for RF signal processing. A typical RF system requires multiple IPDs in one or more semiconductor packages to perform the necessary electrical functions.

An electrically conductive bump material is deposited over build-up interconnect structure 220 and electrically connected to conductive layer 224 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 224 using a suitable attachment or bonding process. In one embodiment, the bump material is reflowed by heating the material above its melting point to form spherical balls or bumps 236. In some applications, bumps 236 are reflowed a second time to improve electrical contact to conductive layer 224. The bumps can also be compression bonded to conductive layer 224. Bumps 236 represent one type of interconnect structure that can be formed over conductive layer 224. The interconnect structure can also use bond wires, stud bump, micro bump, or other electrical interconnect.

In FIG. 14i, an underfill material 238 such as epoxy resin is deposited between semiconductor die 208 and 230. Semiconductor die 208 and 230 are singulated with saw blade or laser cutting device 240 into individual semiconductor devices.

FIG. 15 shows FO-WLCSP 242 after singulation. Semiconductor die 230 is mounted in cavity 226 formed between portions of the bottom-side build-up interconnect structure 220 of semiconductor die 208 using dam walls 204 and masking layer 218. Semiconductor die 208 and 230 are electrically interconnected with bumps 234. By placing semiconductor die 230 in cavity 226, the separation between the die is reduced resulting in a short and efficient signal path to improve electrical performance and increase operating speed of FO-WLCSP 242. The height of semiconductor die 230, including bumps 234, is less than the height of bumps 236. The overall height of FO-WLCSP 242 is reduced with the above novel manufacturing process and structure.

The various embodiments shown in FIGS. 5-13 are applicable to FIG. 15.

While one or more embodiments of the present invention have been illustrated in detail, the skilled artisan will appreciate that modifications and adaptations to those embodi-

What is claimed is:

1. A method of making a semiconductor device, comprising:
   providing a temporary carrier;
   mounting a first semiconductor die with its active surface oriented to the temporary carrier;
   depositing an encapsulant over the first semiconductor die and temporary carrier;
   removing the temporary carrier to expose a first side of the encapsulant and active surface of the first semiconductor die;
   forming a masking layer over the active surface of the first semiconductor die;
   forming a first interconnect structure over the first side of the encapsulant, the masking layer blocking formation of the first interconnect structure over the active surface of the first semiconductor die;
   removing the masking layer to form a cavity over the active surface of the first semiconductor die; and
   mounting a second semiconductor die in the cavity, the second semiconductor die being electrically connected to the active surface of the first semiconductor die.

2. The method of claim 1, further including forming a conductive through silicon via through the first semiconductor die.

3. The method of claim 1, further including forming a shielding layer over the second semiconductor die.

4. The method of claim 1, further including:
   forming a second interconnect structure over a back surface of the first semiconductor die opposite the active surface of the first semiconductor die; and
   mounting a third semiconductor die to the second interconnect structure.

5. The method of claim 1, further including forming a bump between the first semiconductor die and the second semiconductor die to electrically connect the first semiconductor die to the second semiconductor die.

6. A method of making a semiconductor device, comprising:
   providing a first semiconductor die;
   depositing an encapsulant over the first semiconductor die
   forming a masking layer over an active surface of the first semiconductor die;
   forming a first interconnect structure over the encapsulant and the first semiconductor die; and
   removing the masking layer to form a cavity extending through the first interconnect structure to expose the active surface of the first semiconductor die.

7. The method of claim 6, further including:
   forming the first interconnect structure over the encapsulant with the masking layer blocking formation of the first interconnect structure over a portion of the active surface of the first semiconductor die; and
   removing the masking layer to form the cavity over the portion of the active surface of the first semiconductor die.

8. The method of claim 6, further including forming a conductive through silicon via through the first semiconductor die.

9. The method of claim 6, further including mounting a heat spreader to the active surface of the first semiconductor die.

10. The method of claim 6, further including mounting a heat sink to a back surface of the first semiconductor die opposite the active surface of the first semiconductor die.

11. The method of claim 6, further including:
    forming a second interconnect structure over a back surface of the first semiconductor die opposite the active surface of the first semiconductor die; and
    mounting a second semiconductor die to the second interconnect structure.

12. The method of claim 6, further including removing a portion of the encapsulant opposite the first interconnect structure to expose a back surface of the semiconductor die.

13. The method of claim 6, further including:
    providing a temporary carrier;
    mounting the semiconductor die with the active surface of the first semiconductor die oriented towards the temporary carrier; and
    removing the temporary carrier to expose the encapsulant.

14. The method of claim 13, further including:
    forming a dam wall over the temporary carrier;
    mounting the first semiconductor die to the temporary carrier so that a portion of the active surface resides within the dam wall;
    depositing the encapsulant over the first semiconductor die and temporary carrier, the dam wall preventing spreading of the encapsulant to the portion of the active surface of the first semiconductor die;
    removing the temporary carrier; and
    forming the first interconnect structure over the encapsulant, the masking layer blocking formation of the first interconnect structure over the active surface of the first semiconductor die.

15. The method of claim 6, further including mounting a semiconductor component within the cavity over the semiconductor die with the semiconductor component being electrically connected to the semiconductor die.

16. The method of claim 15, wherein the semiconductor component is a second semiconductor die or discrete semiconductor device.

17. The method of claim 15, further including depositing a second encapsulant around the semiconductor component.

18. The method of claim 15, further including forming a shielding layer over the semiconductor component.

19. The method of claim 15, further including depositing an underfill material between the semiconductor die and the semiconductor component.

20. The method of claim 15, further including forming a bump between the first semiconductor die and the semiconductor component to electrically connect the semiconductor die to the semiconductor component.

21. A method of making a semiconductor device, comprising:
    providing a first semiconductor die;
    depositing an encapsulant over the first semiconductor die;
    forming a masking layer over an active surface of the first semiconductor die; and
    forming a first interconnect structure over the encapsulant and around the masking layer without covering a portion of the active surface of the first semiconductor die with the first interconnect structure.

22. The method of claim 21, further including:
    forming the first interconnect structure over the encapsulant and first semiconductor die with the masking layer blocking formation of the first interconnect structure over the portion of the active surface of the first semiconductor die; and
    removing the masking layer to form a cavity over the active surface of the first semiconductor die.

23. The method of claim 21, further including:
 forming a dam wall around the portion of the active surface of the first semiconductor die;
 depositing the encapsulant over the first semiconductor die, the dam wall preventing spreading of the encapsulant to the portion of the active surface of the first semiconductor die;
 forming the first interconnect structure over the encapsulant with the masking layer blocking formation of the first interconnect structure over the portion of the active surface of the first semiconductor die; and
 removing the masking layer to form a cavity over the active surface of the first semiconductor die.

24. The method of claim 21, further including forming a conductive through silicon via through the first semiconductor die.

25. The method of claim 21, further including:
 forming a second interconnect structure over a back surface of the first semiconductor die opposite the active surface of the first semiconductor die; and
 mounting a second semiconductor die to the second interconnect structure.

26. The method of claim 21, further including removing a portion of the encapsulant opposite the first interconnect structure to expose a back surface of the first semiconductor die.

27. The method of claim 21, further including mounting a semiconductor component over the active surface of the first semiconductor die between portions of the first interconnect structure with the semiconductor component being electrically connected to the active surface of the first semiconductor die.

28. The method of claim 27, wherein the semiconductor component is a second semiconductor die or discrete semiconductor device.

29. The method of claim 27, further including depositing an underfill material between the first semiconductor die and the semiconductor component.

30. The method of claim 27, further including forming a bump between the first semiconductor die and the semiconductor component to electrically connect the first semiconductor die to the semiconductor component.

31. A method of making a semiconductor device, comprising:
 providing a semiconductor die;
 depositing an encapsulant over the semiconductor die;
 forming a masking layer over a first surface of the semiconductor die; and
 forming an interconnect structure over the encapsulant and the semiconductor die with the masking layer blocking formation of the interconnect structure over a portion of the first surface of the semiconductor die.

32. The method of claim 31, further including removing the masking layer to form a cavity over the portion of the first surface of the semiconductor die.

33. The method of claim 31, further including mounting a semiconductor component over the first surface of the semiconductor die.

34. The method of claim 33, further including depositing an underfill material between the semiconductor die and the semiconductor component.

35. The method of claim 31, further including forming a conductive through silicon via through the semiconductor die.

36. The method of claim 31, further including removing a portion of the encapsulant opposite the interconnect structure to expose a second surface of the semiconductor die.

* * * * *